United States Patent
Cheng et al.

(10) Patent No.: US 8,803,233 B2
(45) Date of Patent: Aug. 12, 2014

(54) JUNCTIONLESS TRANSISTOR

(75) Inventors: Kangguo Cheng, Schenectady, NY (US); Bruce B. Doris, Brewster, NY (US); Ali Khakifirooz, Mountain View, CA (US); Pranita Kulkarni, Slingerlands, NY (US); Tak H. Ning, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 31 days.

(21) Appl. No.: 13/242,861

(22) Filed: Sep. 23, 2011

(65) Prior Publication Data
US 2013/0075817 A1 Mar. 28, 2013

(51) Int. Cl.
H01L 29/778 (2006.01)

(52) U.S. Cl.
USPC ........... 257/335; 257/345; 257/348; 257/349; 257/402; 257/403

(58) Field of Classification Search
USPC .................. 257/335, 345, 348, 349, 402, 403
See application file for complete search history.

(56) References Cited

U.S. PATENT DOCUMENTS

| | | | |
|---|---|---|---|
| 5,672,530 A | 9/1997 | Hsu | |
| 5,918,129 A | 6/1999 | Fulford, Jr. et al. | |
| 5,952,701 A * | 9/1999 | Bulucea et al. | 257/407 |
| 6,100,146 A | 8/2000 | Gardner et al. | |
| 6,566,696 B1 | 5/2003 | Cheek et al. | |
| 7,033,916 B1 | 4/2006 | Pelella et al. | |
| 7,067,868 B2 * | 6/2006 | Thean et al. | 257/296 |
| 7,244,996 B2 * | 7/2007 | Hirashita et al. | 257/384 |
| 7,271,457 B2 | 9/2007 | Quinn | |
| 7,355,223 B2 * | 4/2008 | Harris et al. | 257/256 |
| 7,595,243 B1 | 9/2009 | Bulucea et al. | |
| 7,667,271 B2 | 2/2010 | Yu et al. | |
| 7,772,676 B2 | 8/2010 | Han et al. | |
| 2006/0170053 A1 | 8/2006 | Yeo et al. | |
| 2006/0214231 A1 | 9/2006 | Shah et al. | |
| 2006/0220072 A1 | 10/2006 | Harris et al. | |
| 2008/0251862 A1 | 10/2008 | Fonash et al. | |
| 2008/0285350 A1 | 11/2008 | Yeh | |

(Continued)

FOREIGN PATENT DOCUMENTS

WO 2010025938 3/2010

OTHER PUBLICATIONS

Non Final Office Action dated Apr. 25, 2013 for U.S. Appl. No. 13/618,054.

(Continued)

Primary Examiner — Michael Shingleton
(74) Attorney, Agent, or Firm — Stephen Bongini; Fleit Gibbons Gutman Bongini & Bianco PL

(57) ABSTRACT

A transistor includes a semiconductor layer, and a gate dielectric is formed on the semiconductor layer. A gate conductor is formed on the gate dielectric and an active area is located in the semiconductor layer underneath the gate dielectric. The active area includes a graded dopant region that has a higher doping concentration near a top surface of the semiconductor layer and a lower doping concentration near a bottom surface of the semiconductor layer. This graded dopant region has a gradual decrease in the doping concentration. The transistor also includes source and drain regions that are adjacent to the active region. The source and drain regions and the active area have the same conductivity type.

20 Claims, 8 Drawing Sheets

(56) References Cited

U.S. PATENT DOCUMENTS

2009/0090966 A1* 4/2009 Thorup et al. ............... 257/328
2010/0109044 A1* 5/2010 Tekleab et al. ............... 257/190
2010/0193882 A1 8/2010 Hoentschel et al.
2010/0276662 A1 11/2010 Colinge

OTHER PUBLICATIONS

Final Office Action dated Oct. 28, 2013 for U.S Appl. No. 13/618,054.

Non Final Office Action dated Feb. 13, 2014 received for U.S. Appl. No. 13/618,054.

* cited by examiner

JUNCTIONLESS TRANSISTOR

FIELD OF THE INVENTION

The present invention generally relates to the field of semiconductors, and more particularly relates to junctionless transistors.

BACKGROUND OF THE INVENTION

Junctionless transistors have been proposed as an alternative to conventional MOSFET transistors for future CMOS technology. However, one disadvantage of conventional junctionless transistors is that they suffer from poor short-channel control.

SUMMARY OF THE INVENTION

In one embodiment, a transistor is disclosed. The transistor comprises a semiconductor layer. A gate dielectric is formed on the semiconductor layer. A gate conductor is formed on the gate dielectric. An active area is located in the semiconductor layer underneath the gate dielectric. The active area comprises a graded dopant region that has a higher doping concentration near a top surface of the semiconductor layer and a lower doping concentration near a bottom surface of the semiconductor layer. This graded dopant region has a gradual decrease in the doping concentration. The transistor also comprises source and drain regions that are adjacent to the active region. The source and drain regions and the active area have the same conductivity type.

A further embodiment discloses an integrated circuit that comprises a semiconductor layer. The integrated circuit includes a first transistor and a second transistor. The first transistor comprises a first gate dielectric formed on the semiconductor layer. A first gate conductor is formed on the gate dielectric. A first active area is located in the semiconductor layer underneath the first gate dielectric. The first active area comprises a graded dopant region that has a higher doping concentration near a top surface of the semiconductor layer and a lower doping concentration near a bottom surface of the semiconductor layer, with a gradual decrease in the doping concentration. First source and drain regions are adjacent to the first active region. The first source and drain regions and the first active area have the same conductivity type.

The second transistor comprises a second gate dielectric that is formed on the semiconductor layer. A second gate conductor is formed on the second gate dielectric. A second active area is located in the semiconductor layer underneath the second gate dielectric. The second active area is undoped. Second source and drain regions are adjacent to the second active region. The second source and drain regions have a uniform dopant concentration.

Other objects, features, and advantages of the present invention will become apparent from the following detailed description. It should be understood, however, that the detailed description and specific examples, while indicating various embodiments of the present invention, are given by way of illustration only and various modifications may naturally be performed without deviating from the present invention.

DETAILED DESCRIPTION

Figure 11:
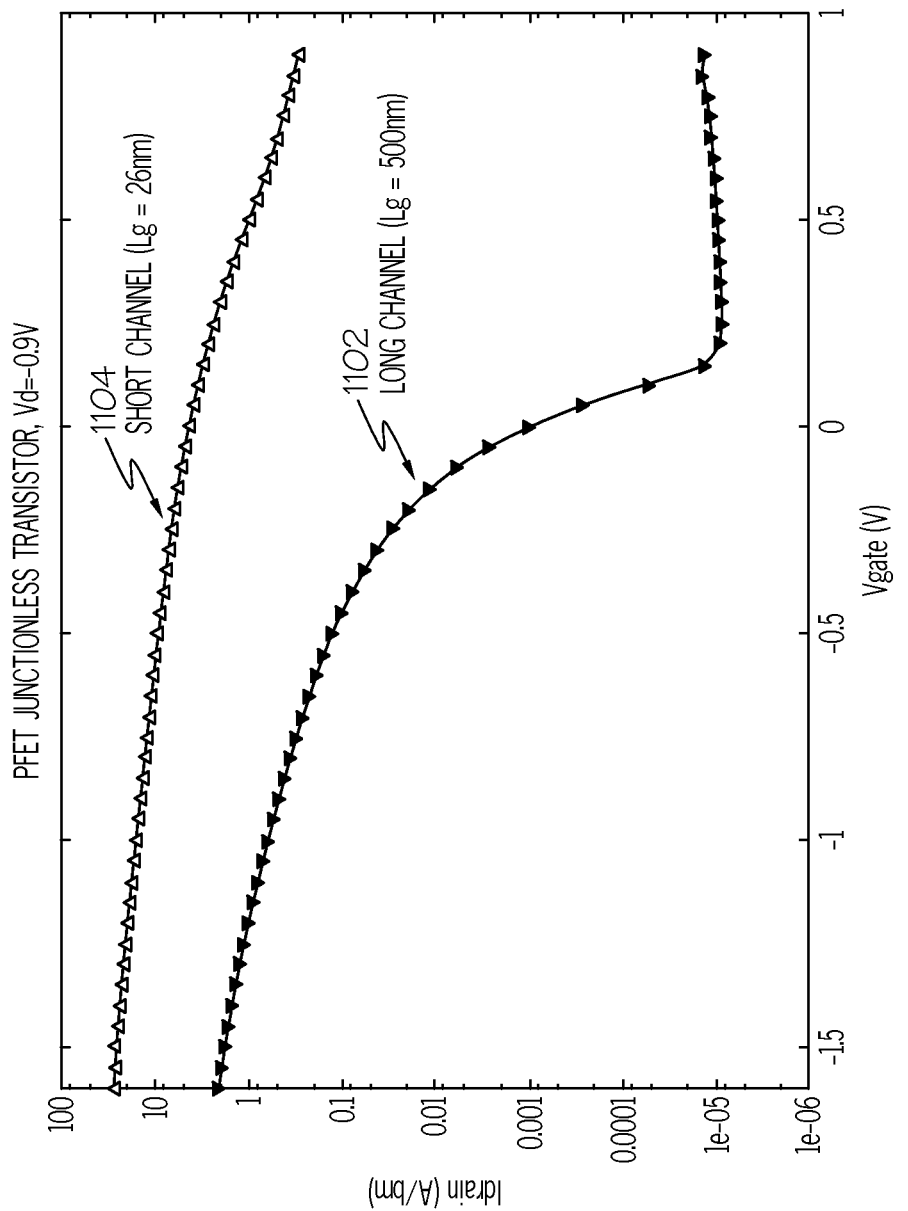
FIG. 11 is a graph illustrating short channel and long channel performance of a conventional junctionless transistor.
Figure 12:
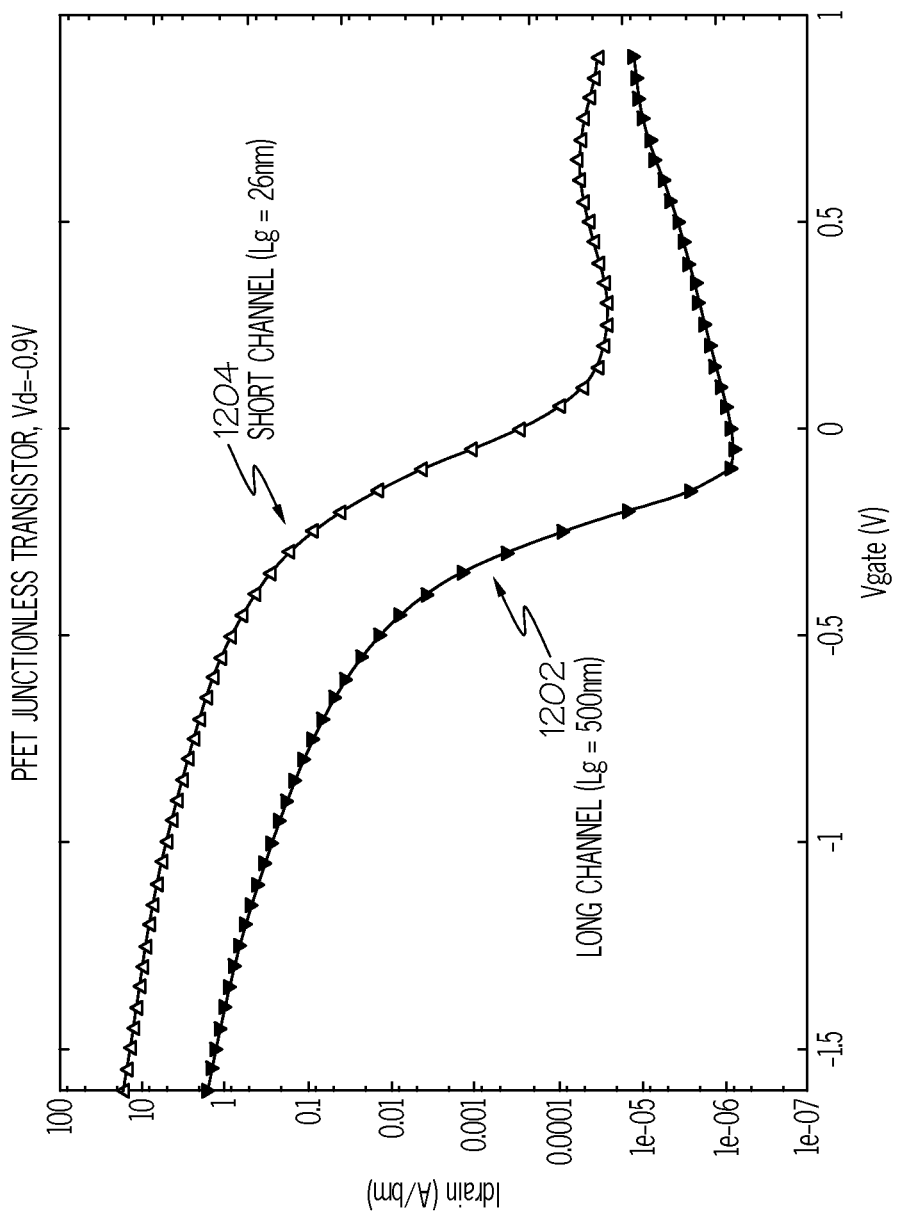
FIG. 12 is a graph illustrating short channel and long channel performance of a junctionless transistor according to one embodiment of the present invention.

Embodiments of the present invention provide a junctionless transistor and a method for fabricating the same. The junctionless transistor of the present invention provides improved short channel control as compared to conventional junctionless transistors. FIG. 11 shows a simulation of a conventional P-channel field-effect transistor (PFET) with uniform channel doping. The lower curve 1102 represents a long channel device with a gate length of 500 nm, a uniform channel doping of $5E19/cm3$, and a silicon-on-insulator (SOI) thickness of 6 nm. As shown, the device functions well with a long channel of 500 nm. However, when the gate length is scaled to 26 nm this conventional junctionless transistor exhibits very poor short channel control, as shown by the upper curve 1104. In fact, this conventional junctionless transistor performs more like a resistor (i.e., no on or off state) with respect to short channel. The junctionless transistor of the present invention, on the other hand, provides for much improved short channel control, as shown in the simulation of FIG. 12. The upper curve 1204 for a short channel device shows a five order of magnitude difference between the on and off states of the device.

Figure 1:
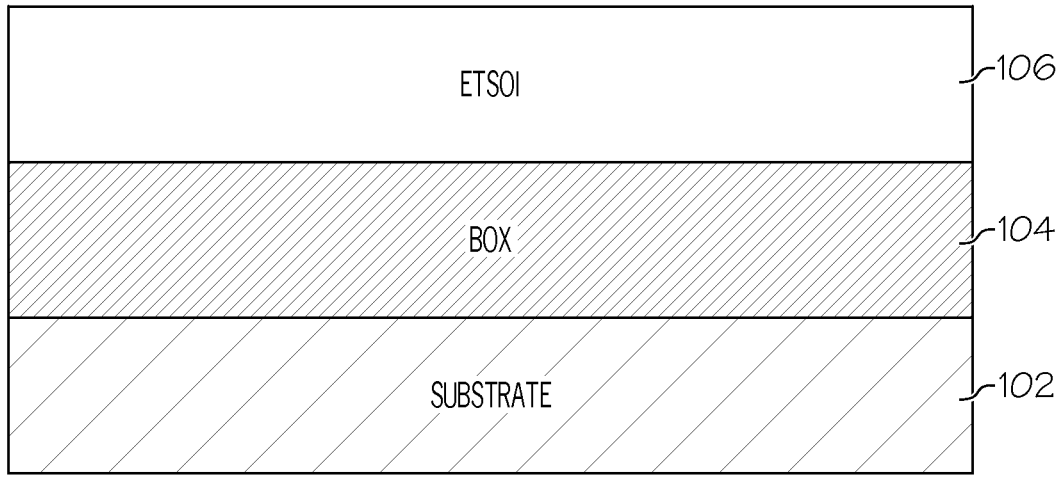
FIGS. 1 to 6 are cross-sectional views of a process for forming a junctionless transistor with a graded dopant region according to one embodiment of the present invention.

FIGS. 1 to 6 illustrate a process for forming a junctionless transistor with localized and graded channel doping according to one embodiment of the present invention. As shown in FIG. 1, there is provided an SOI wafer having a silicon substrate 102, a buried insulator layer (e.g., buried oxide "BOX" 104, and an extremely thin silicon-on-insulator (ETSOI) layer 106. The ETSOI layer 106 of this embodiment has a thickness ranging from about 1 nm to 20 nm, while in another embodiment the ETSOI layer 106 has a thickness ranging from about 3 nm to 10 nm. In the illustrated embodiment, the SOI wafer is formed by thinning a "thick" SOI wafer (with a thickness in the 30 nm to 90 nm range) using oxidation and a hydrofluoric acid (HF) wet etch. The ETSOI layer 106 can be any semiconducting material, including but not limited to Si (silicon), strained Si, SiC (silicon carbide), Ge (geranium), SiGe (silicon germanium), SiGeC (silicon-germanium-carbon), Si alloys, Ge alloys, GaAs (gallium arsenide), InAs (indium arsenide), InP (indium phosphide), or any combination thereof.

Figure 2:
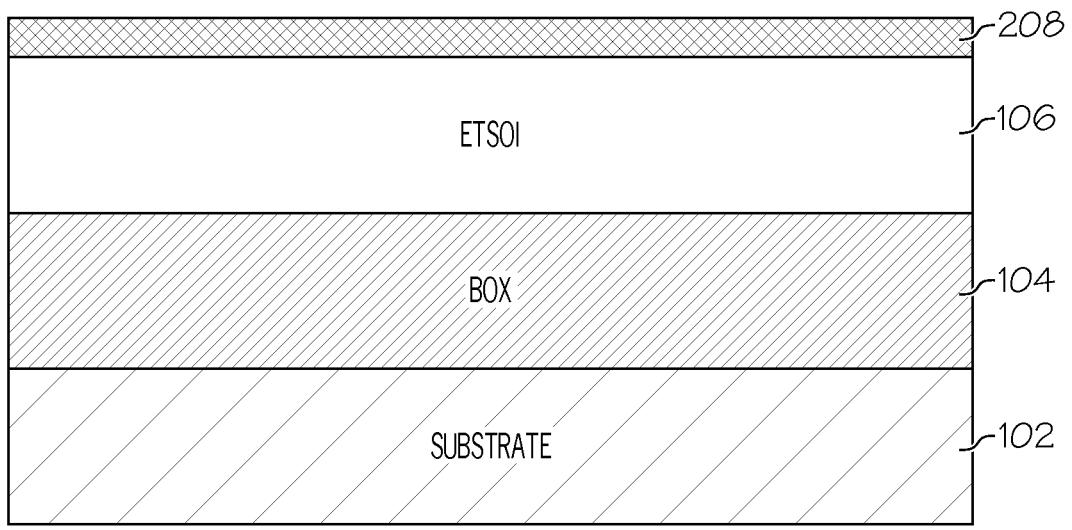

As shown in FIG. 2, a doped material 208 is formed on exposed surfaces of the ETSOI layer 106. In this embodiment, the doped material 208 is formed through epitaxial growth. When the chemical reactants are controlled and the system parameters set correctly, the depositing atoms arrive at the surface of the ETSOI layer 106 with sufficient energy to move around on the surface and orient themselves to the crystal arrangement of the atoms of the deposition surface.

Thus, an epitaxial film deposited on a [100] crystal surface will take on a [100] orientation. If, on the other hand, the wafer has an amorphous surface layer, the depositing atoms have no surface to align to and form polysilicon instead of single crystal silicon. Silicon sources for the epitaxial growth include silicon tetrachloride, dichlorosilane (SiH2Cl2), and silane (SiH4). The temperature for this epitaxial silicon deposition is from 550° C. to 900° C.

In the illustrated embodiment, the doped material 208 is formed through selective-epitaxial growth of SiGe atop the ETSOI layer 106. The Ge content of the epitaxial grown SiGe ranges from 5% to 60% (by atomic weight). In another embodiment, the Ge content of the epitaxial grown SiGe ranges from 10% to 40%. The epitaxial grown SiGe of the illustrated embodiment is under an intrinsic compressive strain that is produced by a lattice mismatch between the larger lattice dimension of the SiGe and the smaller lattice dimension of the layer on which the SiGe is epitaxially grown. The epitaxial grown SiGe produces a compressive strain in the portion of the ETSOI layer 106 in which the channel of a semiconductor device is subsequently formed.

In this embodiment, the doped material 208 is doped with a first conductivity type dopant during the epitaxial growth process. P-type MOSFET devices are produced by doping the doped material 208 with elements from group III of the periodic table (e.g., boron, aluminum, gallium, or indium). As an example, the dopant can be boron in a concentration ranging from $1\times10E18$ atoms/cm3 to $2\times10E21$ atoms/cm3.

In another embodiment, the doped material 208 is composed of epitaxially grown Si:C (carbon doped silicon). The carbon (C) content of the epitaxial grown Si:C ranges from 0.3% to 10% (by atomic weight). In another embodiment, the carbon (C) content of the epitaxial grown Si:C ranges from 1% to 2%. In one embodiment, the epitaxial grown Si:C is under an intrinsic tensile strain that is produced by a lattice mismatch between the smaller lattice dimension of the Si:C and the larger lattice dimension of the layer on which the Si:C is epitaxially grown. The epitaxial grown Si:C produces a tensile strain in the ETSOI layer 208 in which the channel of a semiconductor device is subsequently formed. In this embodiment, the doped material 208 is doped with a second conductivity type dopant during the epitaxial growth process. N-type MOSFET devices are produced by doping the doped material 208 with elements from group V of the periodic table (e.g., phosphorus, antimony, or arsenic).

Alternatively, the doped material 208 is a doped dielectric, for example, doped oxide, formed by deposition, including but not limited to, atomic layer deposition (ALD), molecular layer deposition (MLD), chemical vapor deposition (CVD), low-pressure chemical vapor deposition (LPCVD), plasma enhanced chemical vapor deposition (PECVD), high density plasma chemical vapor deposition (HDPCVD), sub-atmospheric chemical vapor deposition (SACVD), rapid thermal chemical vapor deposition (RTCVD), in-situ radical assisted deposition, high temperature oxide deposition (HTO), low temperature oxide deposition (LTO), ozone/TEOS deposition, limited reaction processing CVD (LRPCVD), ultrahigh vacuum chemical vapor deposition (UHVCVD), metalorganic chemical vapor deposition (MOCVD), molecular beam epitaxy (MBE), physical vapor deposition, sputtering, plating, evaporation, spin-on-coating, ion beam deposition, electron beam deposition, laser assisted deposition, chemical solution deposition, or any combination of those methods. In one embodiment, the dopant in the doped material layer 208 is boron, arsenic, phosphorus, or indium, with a concentration ranging from $1\times10E18$ atoms/cm3 to $2\times10E21$ atoms/cm3.

Figure 3:
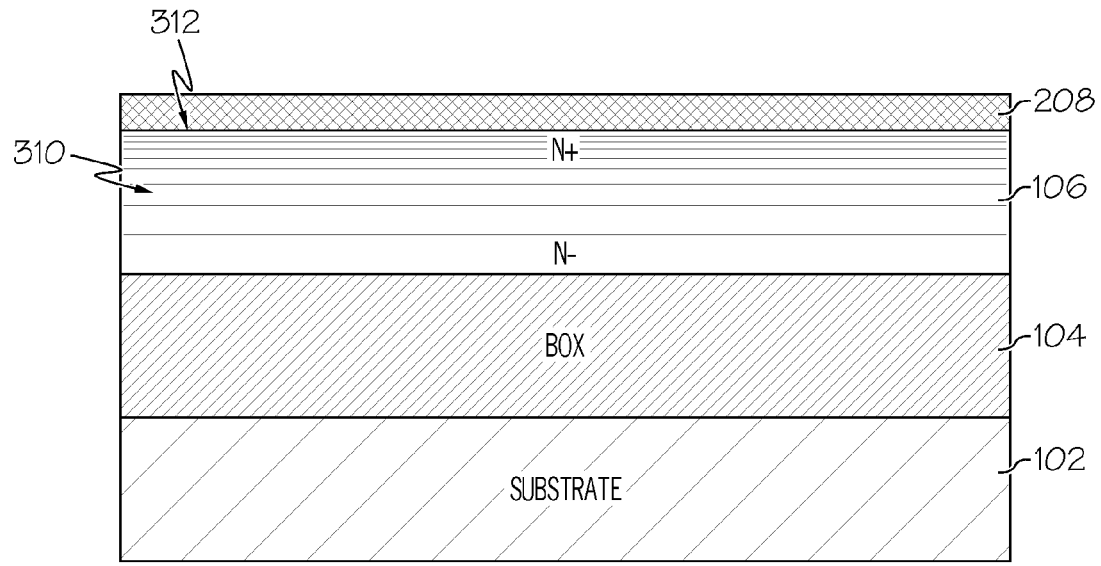

After the doped material 208 is formed, the dopant is diffused into the ETSOI layer 106 to form a graded dopant region 310 within the ETSOI layer 106, as shown in FIG. 3. In this embodiment, the graded dopant region 310 spans the entire depth of the ETSOI layer 106. However, in other embodiments, the graded dopant region 310 partially spans the depth of the ETSOI layer 106. While the illustrated example uses an n-type dopant, the description is also applicable to the use of p-type dopant. The graded dopant region 310 has a higher doping concentration near the top surface 312 of the ETSOI layer 106 and a lower doping concentration near the BOX layer 104, with a gradual decrease in the doping concentration. For example, with an ETSOI layer thickness of 6 nm, 5E19/cm3 of boron can be localized at the top 2 nm of the ETSOI layer 106, 1E19/cm3 of boron can be localized in the middle 2 nm of the ETSOI layer 106, and 1E16/cm3 of boron, can be localized at the bottom 2 nm of the ETSOI layer 106.

In the illustrated embodiment, the dopant from the doped material 208 is diffused into the ETSOI layer 106 by an annealing processes such as rapid thermal annealing, furnace annealing, flash lamp annealing, laser annealing, or any suitable combination thereof. For example, thermal annealing can be used to diffuse the dopant from the doped material 208 into the ETSOI layer 106 at a temperature ranging from about 700° C. to 1350° C.

Figure 4:
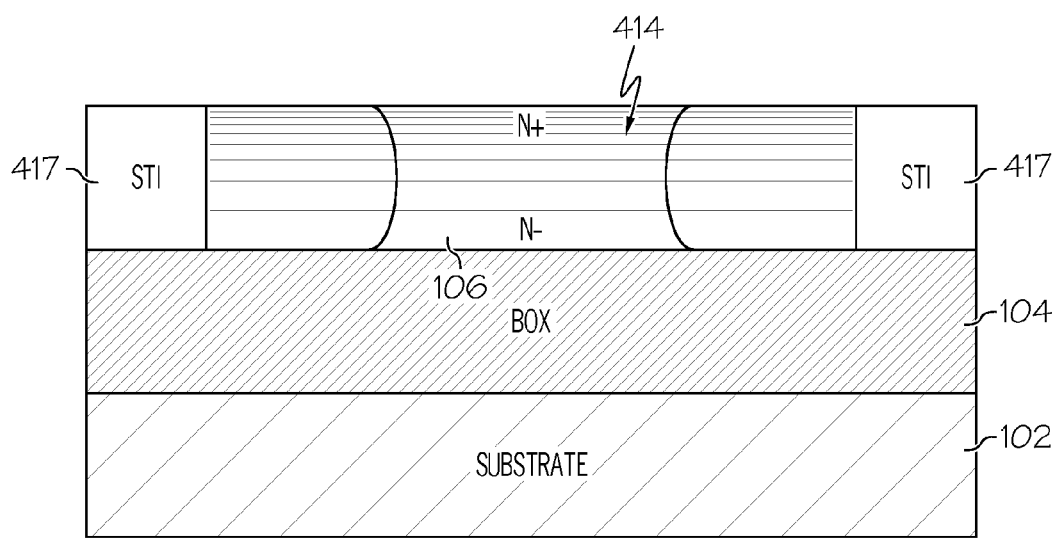

After the graded dopant region 310 is formed within the ETSOI layer 106, etching is performed to remove the doped material 208, as shown in FIG. 4. An active area (channel region) 414 for the transistor is then defined within the ETSOI layer 106 through pad-film deposition, patterning (e.g., by photolithography), and reactive-ion etching (RIE). For example, a pad oxide having a thickness of 2 nm to 10 nm is formed in an oxidation furnace, and a pad nitride is deposited over the pad oxide using low-pressure chemical vapor deposition (LPCVD) or rapid-thermal chemical vapor deposition (RTCVD). Photolithography and a nitride-oxide-silicon RIE are then performed to define the active area.

Next, the active area 414 is isolated, such as through shallow trench isolation (STI), Local Oxidation Of Silicon for Isolation (LOCOS), or mesa isolation. In this embodiment, STI is obtained through deposition of an STI oxide, densification anneals, and chemical-mechanical polishing (CMP) that stops on the pad nitride. This forms an STI region 417 above the BOX layer 104 that is continuous around the active area 414. The pad nitride, along with any STI oxide remaining on the pad nitride, and the pad oxide are then removed (e.g., through wet etching using hot phosphoric acid and HF).

Figure 5:
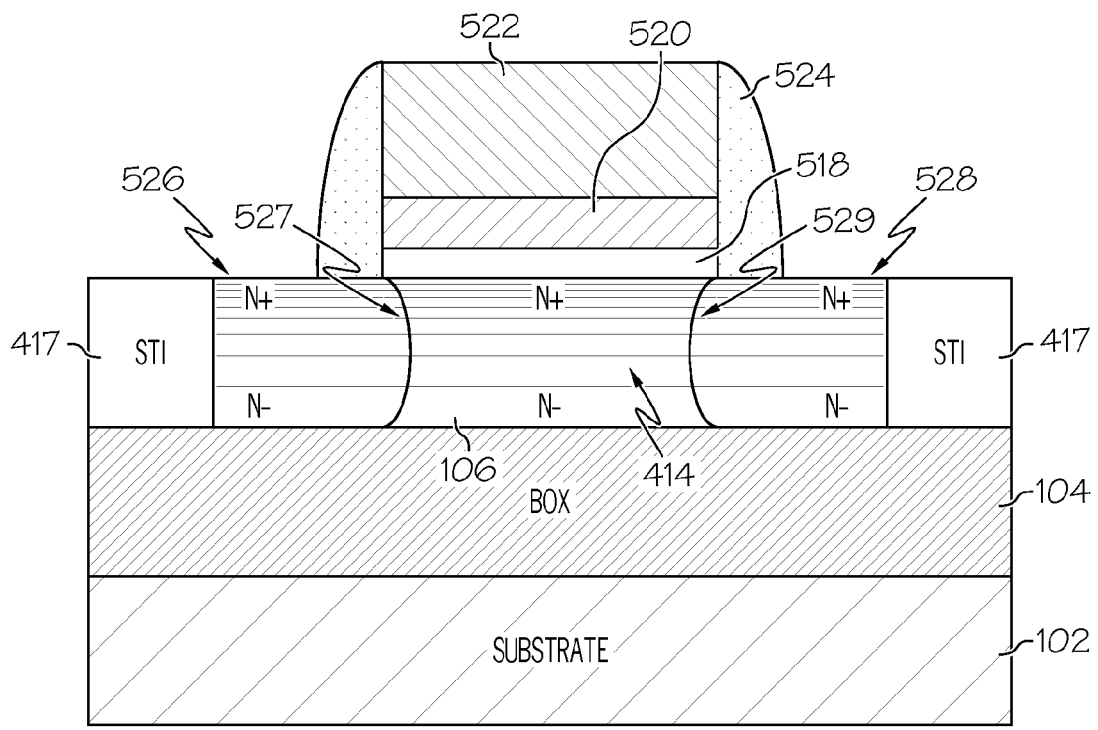

A gate dielectric 518 and a gate conductor 520 are formed on the active region 414, as shown in FIG. 5. More specifically, a stack of a gate dielectric layer and a gate conductor layer are formed on the active region 414. This stack is then patterned and etched to form the gate dielectric 518 and the overlying gate conductor 520 in a portion of the active region 414. The gate dielectric 518 of this embodiment is a conventional dielectric material (such as silicon oxide, silicon nitride, silicon oxynitride, or a stack thereof) that is formed by thermal conversion of a top portion of the active region and/or by chemical vapor deposition (CVD). In an alternative embodiment, the gate dielectric 520 is a high-k dielectric material (such as hafnium oxide, zirconium oxide, lanthanum oxide, aluminum oxide, titanium dioxide, strontium titanate, lanthanum aluminate, yttrium oxide, an alloy thereof, or a silicate thereof) that is formed by CVD, atomic layer deposition (ALD), molecular beam epitaxy (MBE), pulsed laser deposition (PLD), liquid source misted chemical deposition (LSMCD), or physical vapor deposition (PVD). Alternatively, the gate dielectric may comprise any suitable combination of those dielectric materials.

The gate conductor 520 is a semiconductor (e.g., polysilicon) gate layer and/or a metal gate layer. For example, the gate dielectric 518 can be a conventional dielectric material and the gate conductor 520 can be a semiconductor gate layer. Alternatively, the gate dielectric 518 can be a high-k dielectric material and the gate conductor 520 can be a metal gate layer of a conductive refractory metal nitride (such as tantalum nitride, titanium nitride, tungsten nitride, titanium aluminum nitride, triazacyclononane, or an alloy thereof). In a further embodiment, the gate conductor 520 comprises a stack of a metal gate layer and a semiconductor gate layer. In the illustrated embodiment, a gate polysilicon cap 522 is deposited on the gate conductor layer 520, such as through LPCVD or silicon sputtering.

A gate spacer layer 524 formed of a dielectric material (such as silicon oxide, silicon nitride, silicon oxynitride, boron nitride, silicon carbon, or a combination of these) is formed on the sides of the gate stack 518, 520, and 522. In this embodiment, the dielectric layer is formed and then reactive-ion etching is used to remove the dielectric material except from the sidewalls of the gate stack 518, 520, and 522. Alternatively, the gate spacer layer 524 can be allowed to remain on top of the gate stack.

Figure 6:
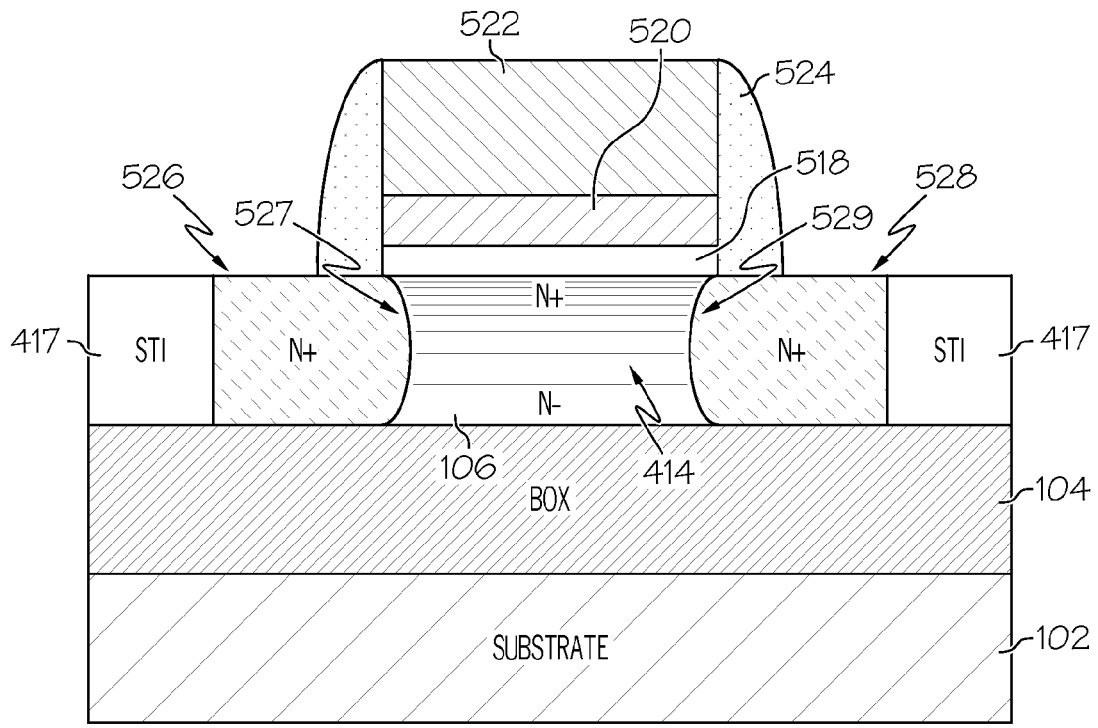

As shown in FIG. 6, source/drain regions 526 and 528 are then formed in the ETSOI layer 106 on the sides of the gate stack 518, 520, and 522, with the active area 414 remaining between the source/drain regions 526 and 528. In this embodiment, source/drain extension regions 527 and 529 are formed in the ETSOI layer 106 below the gate sidewall spacers 524. These source/drain extension regions 527 and 529 are shallower in depth than the source/drain regions 526 and 528 and extend from the source/drain regions 526 and 528 to the active area 414.

In this embodiment, the source/drain regions 526 and 528 and extension regions 527 and 529 have the same type of dopant as the active area 414. In one embodiment, the source/drain regions 526 and 528 and extension regions 527 and 529 are further doped using the same doping type as the active area 414 to lower source/drain resistance. In one embodiment, the source/drain regions 526 and 528 are further doped by ion implantation, gas phase doping, plasma doping, plasma immersion ion implantation, cluster doping, infusion doping, liquid phase doping, or solid phase doping. A subsequent anneal is performed (e.g., millisecond laser anneal or flash anneal) to provide relatively deep diffusions for the source and drain regions 526 and 528. As shown in FIG. 6, the source/drain regions 526 and 528 have a uniform doping concentration while the active area 414 has a graded doping concentration. After further doping source/drain regions 526 and 528, the dopant concentration in the source/drain region is greater than the dopant concentration in the channel region.

Next, silicide areas are formed for contacts. In this embodiment, a metal is deposited on top of the source/drain regions 526 and 528, an anneal is performed to form silicide, and then the metal is selectively removed (e.g., through an aqua regia wet etch). For example, the metal is nickel, cobalt, titanium, platinum, or a combination thereof. Conventional fabrication steps are then performed to form the remainder of the integrated circuit that includes this transistor.

Figure 7:
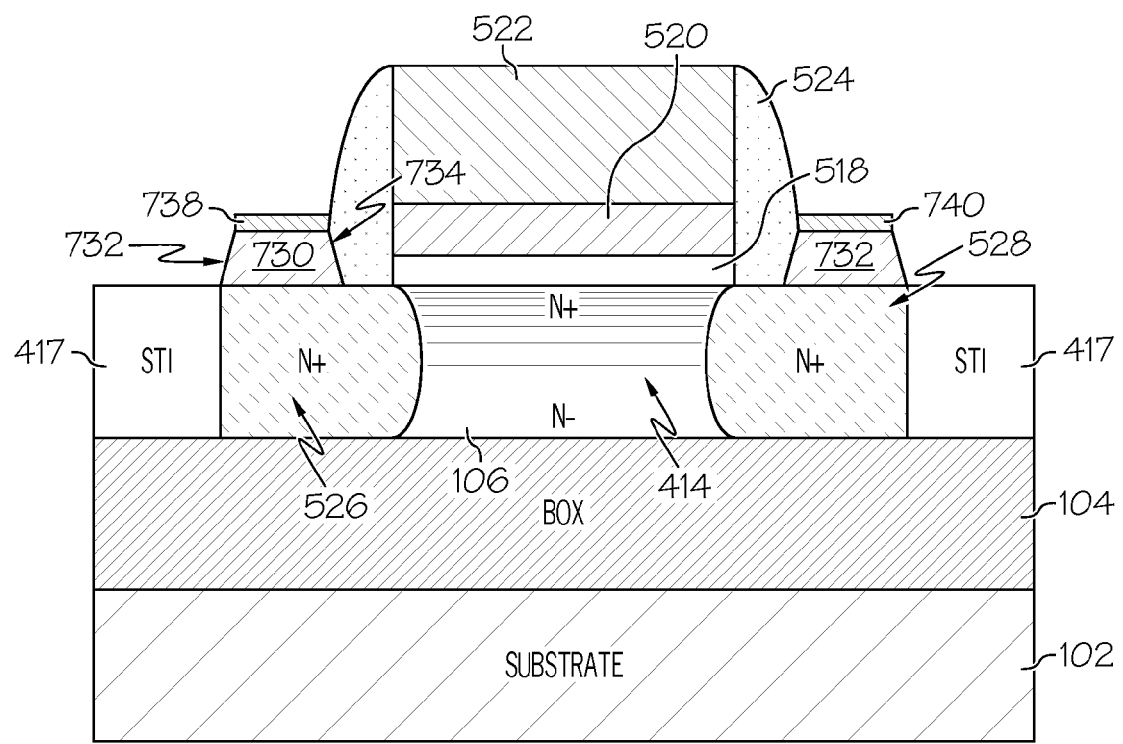
FIG. 7 is a cross-sectional view of a junctionless transistor with a graded dopant region according to another embodiment of the present invention.

In another embodiment, raised source/drain regions are formed, as shown in FIG. 7. In this embodiment, faceted raised source/drain regions 730 and 732 are formed using epitaxy to thicken the silicon where deep source/drain implantation is to be performed in order to reduce the series resistance and increase the on current. For example, an initial pre-cleaning can be performed using an HF wet etch or HF-vapor based chemical oxide removal (COR) to expose the silicon surface of the source/drain regions 526 and 528.

Next, epitaxy that is selective with respect to oxide (and optionally nitride) is used to form the faceted raised source/drain regions 730 and 732 that are in-situ doped with the same doping type as the source/drain regions 526 and 528 and the active region 414. In another embodiment, the raised source/drain regions 730 and 732 do not contain any doping. In the illustrated embodiment, the growth rates for [100] versus [110] oriented planes are engineered so that during the epitaxial growth on [100] silicon, faceted raised/source drain regions are obtained.

The faceted raised source/drain regions 730 and 732 have angled (faceted) sides 734 and 736 with an angle from 5 degrees to 85 degrees (relative to the bottom surface of the faceted raised source/drain region). According to another embodiment, each of the faceted sides 734 and 736 has an angle from 40 degrees to 55 degrees. In another embodiment, the angle for each of the faceted sides 734 and 736 is substantially less than 90 degrees and substantially greater than zero degrees. The angle of one of the sides 734 and 736 can be different than the angle of the other. In a further embodiment, non-faceted (i.e., vertical) raised source/drain regions are formed.

Next, silicide areas 738 and 740 are formed for contacts. In this embodiment, a metal is deposited on top of the raised source/drain regions 730 and 732, an anneal is performed to form silicide, and then the metal is selectively removed. For example, the metal is nickel, cobalt, titanium, platinum, or a combination thereof. Conventional fabrication steps are then performed to form the remainder of the integrated circuit that includes this transistor.

Figure 8:
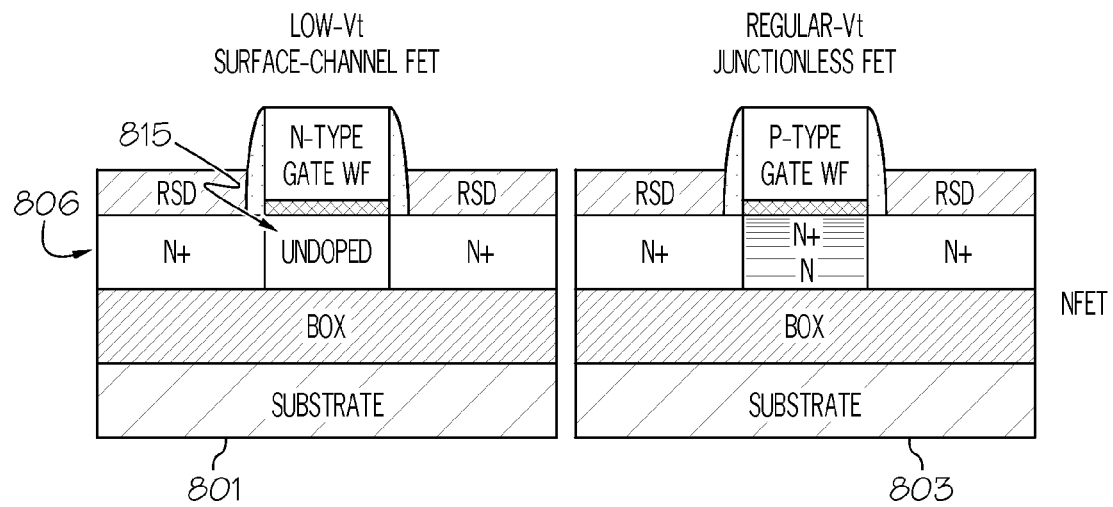
FIGS. 8 and 9 are cross-sectional views of a fully depleted surface channel transistor and a junctionless transistor integrated on the same chip according to one embodiment of the present invention.

In another embodiment of the present invention, fully depleted (FD) CMOS devices with multi-Vt are formed on the same chip with the junctionless transistor. In this embodiment, the FD device is a surface channel FD device with an undoped channel, and four threshold voltages (Vts) (2 for NFET and 2 for PFET devices) are achieved by two gate stacks. FIG. 8 shows a surface channel FD NFET 801 integrated with a junctionless PFET 803. The surface channel FD device 801 is a low-Vt device and the junctionless device 803 is a regular-Vt device. The active area (channel) of the junctionless device 803 is heavily N-doped with a graded profile as described above. The active area (channel) 815 of the surface channel FD device 801 is undoped. The gate work function of the junctionless device 803 is close to P-type Band-edge, and the gate work function of the surface channel FD device 801 is close to N-type Band-edge.

Figure 9:
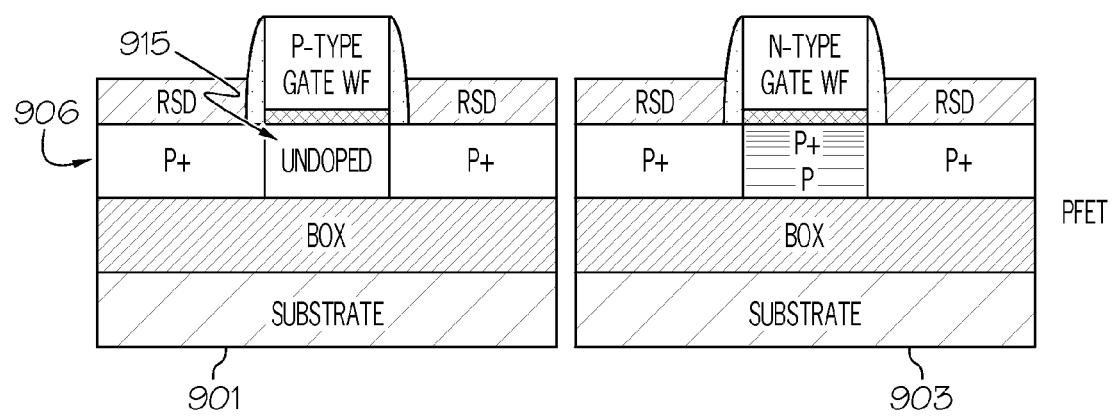

FIG. 9 shows a surface channel FD PFET 901 integrated with a junctionless NFET 903. The surface channel FD device 901 is a low-Vt device and the junctionless device 903 is a regular-Vt device. The active area (channel) of the junctionless device 903 is heavily P-doped with a graded profile. The active area (channel) 915 of the surface channel FD device 901 is undoped. The gate work function of the junctionless device 903 is close to N-type Band-edge, and the gate work function of the surface channel FD device 901 is close to P-type Band-edge.

The junctionless devices 803 and 903 of FIGS. 8 and 9 are formed using the processes described above. For the surface channel FD devices 801 and 901, a mask is formed over the ETSOI layer 806 and 906 prior to the doped material 208 being formed. The mask is a hardmask material such as oxide or nitride. During the formation and dopant diffusion of the doped material 208, the surface channel FD devices 801 and 901 are protected by the mask. After the doped material 208 has been formed and the dopant diffused into the ETSOI layer of the junctionless devices 803 and 903, the mask is removed and the surface channel FD devices 801 and 901 are formed in tandem utilizing the fabrication steps described above for the junctionless devices.

Figure 10:
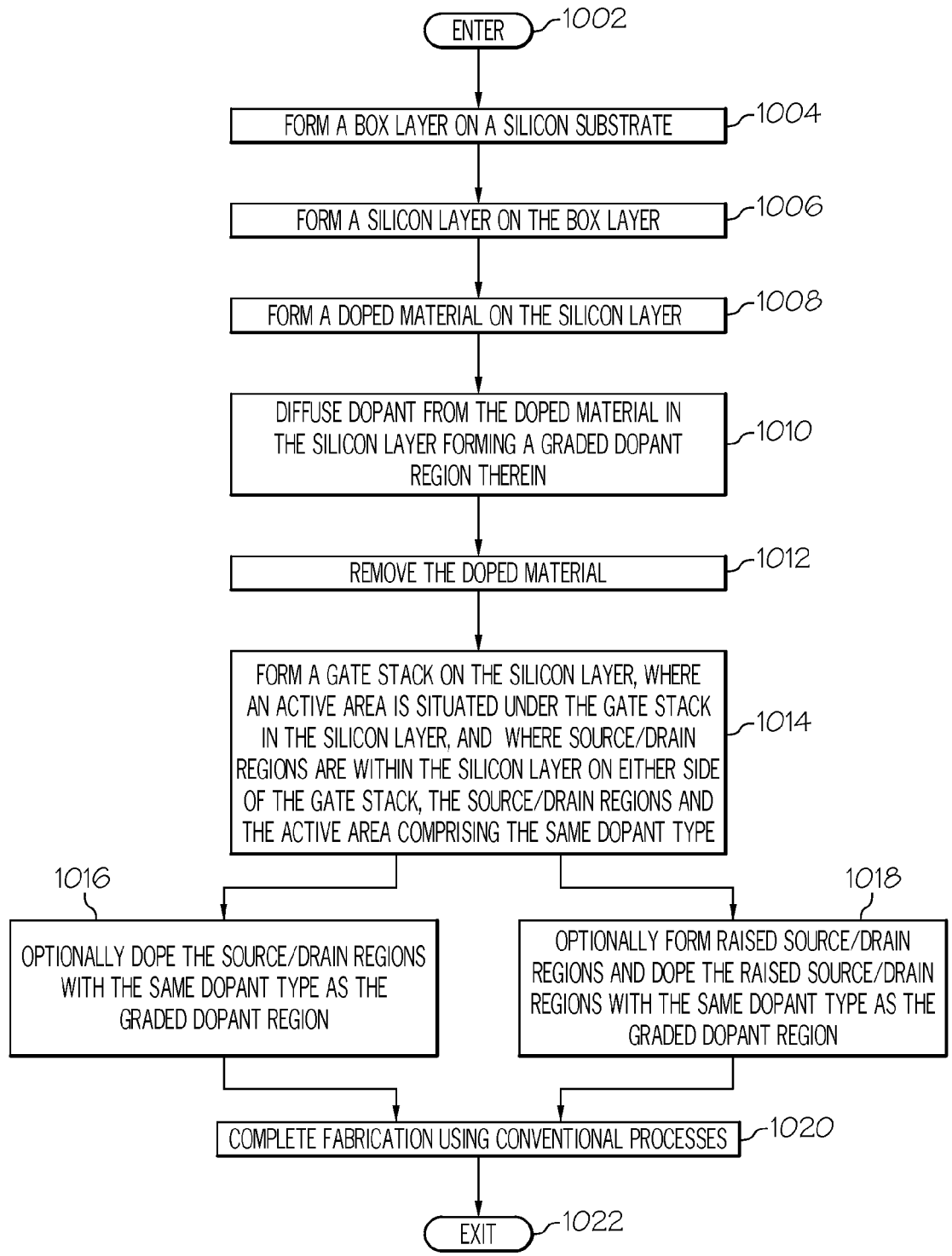
FIG. 10 is an operational flow diagram illustrating a process for forming a junctionless transistor with a graded dopant region according to one embodiment of the present invention.

FIG. 10 is an operational flow diagram illustrating a process for forming a junctionless transistor according to one embodiment of the present invention. A BOX layer 104 is formed on a silicon substrate 102, at step 1004. The BOX layer 104 is formed with a thickness that is less than 50 nm. An ETSOI layer 106 is formed on the BOX layer 104, at step 1006. A doped material 208 is formed on the semiconductor layer 106, at step 1008. The dopant from the doped material 208 is diffused into the ETSOI layer 106 forming a graded dopant region 310, at step 1010.

The doped material 208 is then removed, at step 1012. A gate stack 518, 520, and 522 is formed on the semiconductor layer 106, at 814. Source/drain regions 526 and 528 are formed within the ETSOI layer 106 on the sides of the gate stack 518, 520, and 522 with the active area 414 positioned between the source/drain regions 526 and 528. Source/drain extension regions 527 and 529 are formed within the ETSOI layer 106 below the gate sidewall spacer 524. The source/drain regions 526 and 528, the source/drain extension regions 527 and 529, and the active area 414 all have the same dopant type.

The source/drain regions 526 and 528 are optionally doped, at step 1016. Raised source/drain regions 730 and 732 are optional formed and doped with the same dopant type as the graded dopant region 310, at step 1018. Conventional steps are then performed to complete the fabrication process.

The fabrication process described above is also applicable to forming a surface channel FD device. However, an additional step is performed to form a mask over the ETSOI layer of the surface channel FD device prior to step 1008. Then, after step 1010 has been completed, this mask is removed. The surface channel FD device is formed along with the junctionless transistor using the remaining steps.

It should be noted that some features of the present invention may be used in an embodiment thereof without use of other features of the present invention. As such, the foregoing description should be considered as merely illustrative of the principles, teachings, examples, and exemplary embodiments of the present invention, and not a limitation thereof.

It should be understood that these embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips.

The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard, or other input device, and a central processor.

As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A transistor comprising:
   a semiconductor layer;
   a gate dielectric formed on the semiconductor layer;
   a gate conductor formed on the gate dielectric;
   an active area in the semiconductor layer underneath the gate dielectric, the active area comprising a graded dopant region that is doped with a first conductivity type dopant, the graded dopant region being heavily doped with a graded profile, such that there is a heavy dopant concentration near a top surface of the semiconductor layer that gradually decreases to a lower dopant concentration near a bottom surface of the semiconductor layer; and source and drain regions adjacent to the active area, the source and drain regions being heavily doped with the first conductivity type dopant, wherein the source and drain regions and the active area have the same conductivity type, the semiconductor layer consists of a single layer of a semiconducting material, and the active area, the source region, and the drain region are all located in the semiconductor layer.

2. The transistor of claim 1, further comprising:
a substrate; and a buried insulator layer above the substrate, the semiconductor layer being formed on the buried insulator layer.

3. The transistor of claim 1, wherein the source and drain regions have a uniform dopant concentration.

4. The transistor of claim 1, wherein the source and drain regions have a higher dopant concentration than a maximum dopant concentration in the active area.

5. The transistor of claim 1, further comprising:
a gate spacer surrounding the gate dielectric and the gate conductor, wherein the source region comprises a raised source region that is located above the semiconductor layer, a sidewall of the raised source region being in contact with a sidewall of the gate spacer, and the drain region comprises a raised drain region that is located above the semiconductor layer, a sidewall of the raised drain region being in contact with the sidewall of the gate spacer.

6. The transistor of claim 1, wherein the semiconductor layer has a thickness of less than about 10 nanometers.

7. An integrated circuit comprising a semiconductor layer, the integrated circuit including:
a first transistor comprising:
a first gate dielectric formed on the semiconductor layer;
a first gate conductor formed on the gate dielectric;
a first active area in the semiconductor layer underneath the first gate dielectric, the first active area comprising a graded dopant region that is doped with a first conductivity type dopant, the graded dopant region being heavily doped with a graded profile, such that there is a heavy dopant concentration near a top surface of the semiconductor layer that gradually decreases to a lower dopant concentration near a bottom surface of the semiconductor layer; and
first source and drain regions adjacent to the first active area, the first source and drain regions being heavily doped with the first conductivity type dopant, and the first source and drain regions and the first active area having the same conductivity type; and
a second transistor comprising:
a second gate dielectric formed on the semiconductor layer;
a second gate conductor formed on the second gate dielectric;
a second active area in the semiconductor layer underneath the second gate dielectric, the second active area being undoped; and
second source and drain regions adjacent to the second active area, the second source and drain regions having a uniform dopant concentration,
wherein the semiconductor layer consists of a single layer of a semiconducting material, and the first active area, the fist source region, the first drain region, the second active area, the second source region, and the second drain region are all located in the semiconductor layer.

8. The integrated circuit of claim 7, further comprising:
a substrate; and
a buried insulator layer above the substrate, the semiconductor layer being located on the buried insulator layer.

9. The integrated circuit of claim 7, further comprising:
a first gate spacer surrounding the first gate dielectric and the first gate conductor and a second gate spacer surrounding the second gate dielectric and the second gate conductor, wherein the first source region and the second source region each comprise a raised source region that is located above the semiconductor layer and has a sidewall in contact with a sidewall of one of the gate spacers, and the first drain region and the second drain region each comprise a raised drain region that is located above the semiconductor layer and has a sidewall in contact with a sidewall of one of the gate spacers.

10. The integrated circuit of claim 7,
wherein the first source and drain regions, the second source and drain regions, and the top surface of the semiconductor layer in the graded dopant region are doped P+ with a p-type dopant,
a gate work function of the first transistor is close to N-type Band-edge, and
a gate work function of the second transistor is close to P-type Band-edge.

11. The integrated circuit of claim 7,
wherein the first source and drain regions, the second source and drain regions, and the top surface of the semiconductor layer in the graded dopant region are doped N+ with an n-type dopant,
a gate work function of the first transistor is close to P-type Band-edge, and
a gate work function of the second transistor is close to N-type Band-edge.

12. The integrated circuit of claim 7, wherein the semiconductor layer has a thickness of less than about 10 nanometers.

13. The transistor of claim 1, wherein in the graded dopant region, the dopant concentration of the first conductivity type dopant is substantially equal to 5E19/cm3 near the top surface of the semiconductor layer.

14. The transistor of claim 13,
wherein in the graded dopant region, the dopant concentration of the first conductivity type dopant is substantially equal to 1E16cm3 near the bottom surface of the semiconductor layer, and
in the graded dopant region, the dopant concentration of the first conductivity type dopant is substantially equal to 1E19cm3 near a middle of the semiconductor layer.

15. The transistor of claim 1, wherein the dopant concentration of the first conductivity type dopant in the source and drain regions is substantially equal to the dopant concentration of the first conductivity type dopant near the top surface of the semiconductor layer in the graded dopant region.

16. The transistor of claim 1,
wherein the source and drain regions are doped one of N+ and P+, and
the top surface of the semiconductor layer in the graded dopant, region is also doped one of N+ and P+.

17. The transistor of claim 1, wherein the source and drain regions do not have a higher dopant concentration than a maximum dopant concentration in the active area.

18. The transistor of claim 1, wherein in the graded dopant region, the dopant concentration of the first conductivity type dopant near the bottom surface of the semiconductor layer is not zero.

19. The transistor of claim 1,
wherein the gate dielectric is a high-k dielectric material, and
the gate conductor is a metal gate layer of a conductive refractory metal nitride.

20. The transistor of claim 1,
wherein the gate dielectric is a high-k dielectric material, and
the gate conductor is a stack of a metal gate layer of a conductive refractory metal nitride, and a semiconductor gate layer on the metal gate layer.

* * * * *